United States Patent [19]

Gillery

[11] Patent Number: 4,900,633

[45] Date of Patent: Feb. 13, 1990

[54] HIGH PERFORMANCE MULTILAYER COATINGS

[75] Inventor: Frank H. Gillery, Allison Park, Pa.

[73] Assignee: PPG Industries, Inc., Pittsburgh, Pa.

[21] Appl. No.: 31,317

[22] Filed: Mar. 26, 1987

[51] Int. Cl.$^4$ .................. G02B 1/10; B32B 17/06; B05D 5/06
[52] U.S. Cl. .................. 428/432; 428/434; 204/192.26; 427/166
[58] Field of Search .................. 428/432–434; 427/166; 204/192.26, 191.1

[56] References Cited

U.S. PATENT DOCUMENTS

| | | | |
|---|---|---|---|
| 3,990,784 | 11/1976 | Gelber | 350/166 |
| 4,022,947 | 5/1977 | Grubb et al. | 428/432 |
| 4,450,201 | 5/1984 | Brill et al. | 428/432 X |
| 4,532,181 | 7/1985 | Brill et al. | 428/458 X |
| 4,534,841 | 8/1985 | Hartig et al. | 204/192 |
| 4,535,000 | 8/1985 | Gordon | 427/160 |
| 4,546,050 | 10/1985 | Amberger | 428/630 |

Primary Examiner—Nancy A. B. Swisher
Attorney, Agent, or Firm—Donna L. Seidel

[57] ABSTRACT

A transparent article for reflecting solar energy comprising a titanium oxynitride film, a highly infrared reflective metal film and, optionally, a neutral metal alloy film is disclosed along with a sputtering method for its production.

20 Claims, 3 Drawing Sheets

HIGH PERFORMANCE MULTILAYER COATINGS

BACKGROUND OF THE INVENTION

The present invention relates generally to the art of sputtering metal-containing films on non-metallic substrates, and more particularly to the art of magnetic sputtering of multiple-layer metal-dielectric transparent films on glass.

U.S. Pat. No. 3,990,784 to Gelber discloses a coated architectural glass system comprising a transparent substrate and a multi-layer coating comprising first and second metal layers with a dielectric layer between them, wherein the first and second metal layers have a thickness ratio so that the transmission of the coating can be changed independent of its reflection properties by varying the thickness of the metal layers while maintaining the ratio constant. The dielectric has a thickness such that the reflection from the coating is not strongly colored.

U.S. Pat. No. 4,022,947 to Grubb et al discloses a transparent panel capable of transmitting a desired portion of visible radiation while reflecting a large portion of incident solar radiation and a method of preparing same, by sputtering an iron, nickel and chromium alloy to obtain a transparent metal film, and reactively sputtering the same or a similar alloy in the presence of oxygen to form an oxide film. In one preferred embodiment, the metal film lies between the substrate and the metal oxide film. In another preferred embodiment, the metal oxide film lies between the substrate and the metal film.

U.S. Pat. No. 4,534,841 to Hartig et al. discloses solar-control glazing produced by applying first an oxide layer having an optical thickness of 20 to 280 nanometers to a transparent substrate by cathodic evaporation and second a chromium nitride layer having a geometric thickness of 10 to 40 nanometers. An optical third dielectric layer may be applied to the second layer. The oxide layer is selected from oxides of tin, titanium, and aluminum.

U.S. Pat. No. 4,535,000 to Gordon discloses placing a thin film of metal nitride, e.g. titanium nitride, on a glass substrate by mixing a metal halide with a reducing gas like ammonia at 250 to 320° C. and reacting the gases at the glass surface heated to 400° to 700° C. to form the film on the glass.

U.S. Pat. No. 4,546,050 to Amberger et al discloses a glass sheet with a multilayer coating selected from the group consisting of copper, stainless steel, titanium dioxide; copper, titanium, titanium dioxide; and copper, titanium, titanium nitride.

Architectural glass products with metallic and/or metal oxide films are growing in importance as energy demands for heating and cooling become increasingly expensive. Coated glass architectural products generally fall into two categories, solar energy control and high transmittance, low emissivity coated products.

Solar energy control glass products are generally glass substrates, often tinted, coated with a low visible transmittance colored film which reduces solar energy transmittance through the windows into the building interior, thereby reducing air conditioning costs. These products are most effective in warm climates and are most often seen in commercial construction. In areas where heating costs are of greater concern, and particularly in residential construction, high transmittance, low emissivity coatings are desirable in order to allow high transmittance of visible light into the interior while reflecting infrared radiation to retain heat inside the building. High transmittance, low emissivity coatings are typically multiple layer films wherein an infrared reflecting metal such as silver, gold or copper is sandwiched between anti-reflective metal oxide layers such as bismuth, indium and/or tin oxides. Solar energy control films, on the other hand, are typically single layer films of one or more metals or oxides of metals such as cobalt, iron, chromium, nickel, copper, etc.

Wet chemical methods for producing metallic films for solar energy control are well known from U.S. Pat. Nos. 3,846,152; 4,091,172; 3,723,158 and 3,457,138. Pyrolytic methods for producing metal oxide films for solar energy control are well known from U.S. Pat. Nos. 3,660,061; 3,658,568; 3,978,272 and 4,100,330.

Sputtering technologies for producing high transmittance, low emissivity multiple layer coatings are disclosed in U.S. Pat. Nos. 4,462,884 and No. 4,508,789. Sputtering techniques for producing solar control films are disclosed in U.S. Pat. No. 4,512,863 and No. 4,594,137.

SUMMARY OF THE INVENTION

The present invention provides a novel and superior dielectric film for use in a wide variety of multiple-layer architectural coatings on glass. The present invention involves sputtering a titanium cathode in an atmosphere comprising oxygen and nitrogen in order to deposit a coating comprising titanium oxynitride. The titanium oxynitride film of the present invention is deposited in combination with a highly infrared reflective metal film such as silver and, optionally, a metal film which reduces the luminous reflectance to produce a multi-layer coating which has a relatively saturated color and low emissivity.

DETAILED DESCRIPTION OF THE PREFERRED EMBODIMENTS

Figure 1:
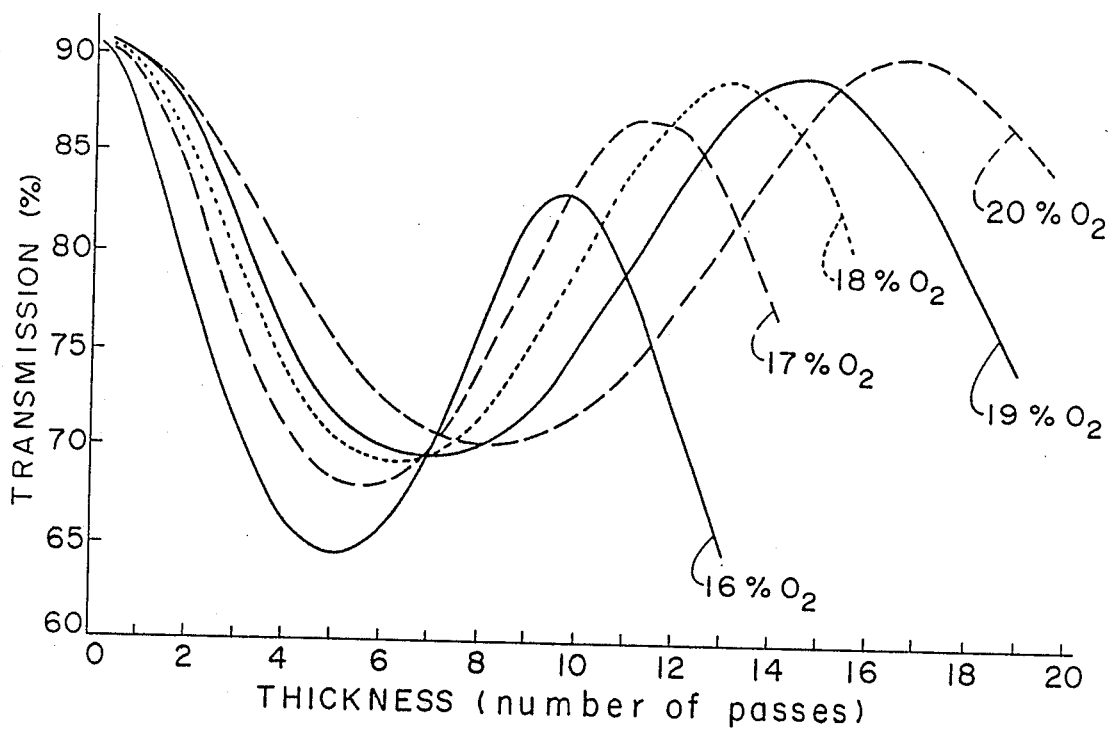
FIG. 1 illustrates the percent transmittance at 550 nanometers (nm) of a titanium oxynitride film on glass as a function of film thickness, measured in number of cathode passes, at various percentages of oxygen in nitrogen.
Figure 2:
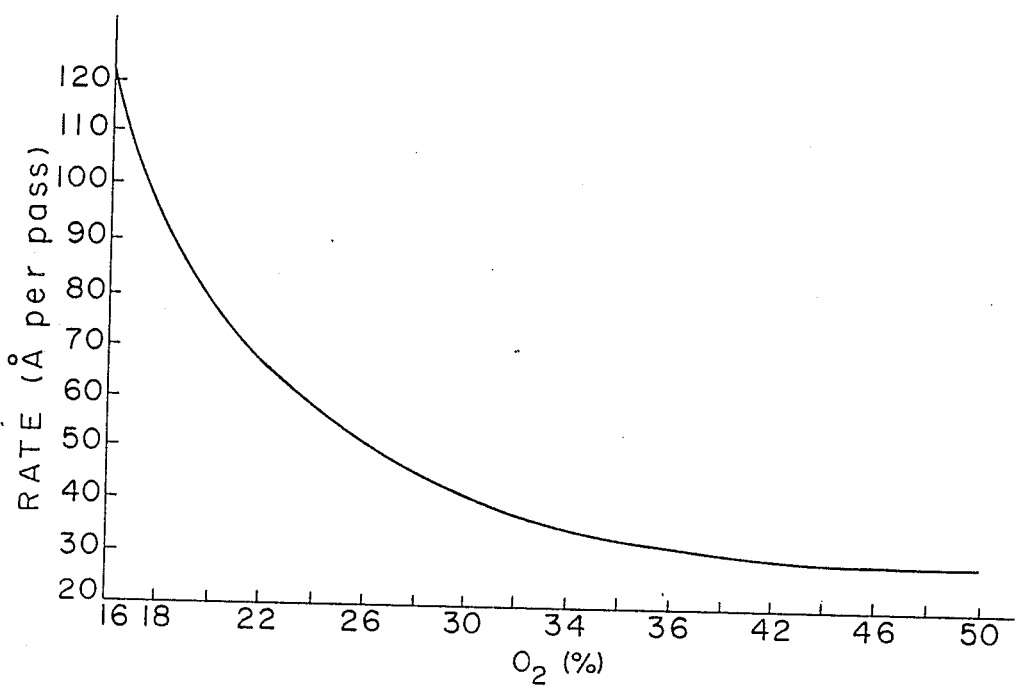
FIG. 2 illustrates the deposition rate, in Angstroms per cathode pass, of a titanium oxynitride film as a function of oxygen concentration in the atmosphere of the coating chamber.
Figure 3:
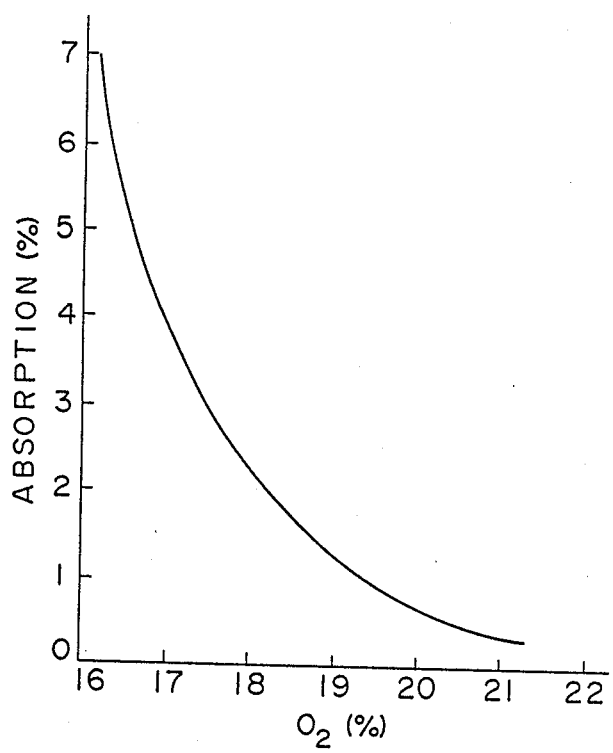
FIG. 3 illustrates the absorption of a quarter wavelength (about 600 Angtroms thick) titanium oxynitride film as a function of the oxygen concentration in the atmosphere of the coating chamber.

In a conventional magnetron sputtering process, a substrate is placed within a coating chamber in facing relation with a cathode having a target surface of the material to be sputtered. Preferred substrates in accordance with the present invention include glass, ceramics and plastics which are not detrimentally affected by the operating conditions of the coating process.

The cathode may be of any conventional design, preferably an elongated rectangular design, connected with a source of electrical potential, and preferably employed in combination with a magnetic field to enhance the sputtering process. At least one cathode target surface comprises titanium which is sputtered in a reactive atmosphere to form a titanium oxynitride film. The anode is preferably a symmetrically designed and positioned assembly as taught in U.S. Pat. No. 4,478,702 by Gillery et al, the disclosure of which is incorporated herein by reference.

The titanium oxynitride of the present invention is deposited by sputtering a titanium cathode in an atmosphere comprising oxygen and nitrogen. The composition of the atmosphere preferably ranges from 10 to 50 percent oxygen and from 90 to 50 percent nitrogen. An atmosphere comprising 10 to 25 percent oxygen and the balance nitrogen is particularly preferred.

The figures show that the properties of the titanium oxynitride change gradually and continuously as the gas composition changes. In contrast, titanium sputtered in an oxygen/argon atmosphere exhibits an abrupt change from oxide to metal. The figures further show that it is possible to choose deposition conditions such that a titanium oxynitride film with desired transmittance and absorbance properties can be sputtered at a desired rate.

Certain desired coating colors can be produced for architectural purposes by combining a colorless dielectric material with inner and outer colored metal layers, or by combining colored metal oxide with a reflective metal. In accordance with the present invention, desired coating colors are obtained by combining titanium oxynitride with a highly infrared reflective metal such as silver to produce intense colors with a high degree of saturation as well as low emissivity. If the luminous reflectance of such a coating is higher than desired, it can be reduced, without sacrificing color purity or emissivity, with an optional coating of a neutral metal such as alloys of nickel and iron, particularly inconel and stainless steel.

The present invention will be further understood from the descriptions at specific examples which follow.

EXAMPLE I

A titanium oxynitride film in combination with a silver film provides a sufficiently reflective and a sufficiently saturated yellow colored film to simulate the appearance of a gold film. A titanium cathode target measuring 5 by 17 inches (about 12.7 by 43.2 centimeters) is powered at 10 kilowatts at 645 volts in a vacuum chamber containing an atmosphere comprising 23 percent oxygen and 77 percent nitrogen at a pressure of 4 millitorr. A glass substrate passes the cathode once at a speed of 108 inches (about 2.74 meters) per minute and is coated with titanium oxynitride. The chamber is evacuated and an atmosphere of pure argon is introduced at a pressure of 4 millitorr. A silver cathode is powered at 441 volts at 2.5 amps to sputter a silver film over the titanium oxynitride coated surface in one pass at 120 inches (about 3.05 meters) per minute. To protect the silver film from oxidation, a very thin layer of nickel alloy is deposited over the silver. A target of Inconel 625, which comprises 18.6 percent chromium, 3 percent iron, 4 percent columbium, 9 percent molybdenum and the balance nickel, is powered at 1 amp at 52 volts. The nickel alloy is sputtered in pure argon at 4 millitorr while the substrate passes at 120 inches (about 3.05 meters) per minute. The coated article has a luminous transmittance of 21.3 percent and reflectance from the uncoated side of 54.6 percent. The color coordinates from the uncoated surface are x = 0.3516 and y = 0.3805. The observed color is pale yellow. This film survives thermal testing without developing haze.

EXAMPLE II

A titanium oxynitride film in combination with a silver film provides a sufficiently reflective and a sufficiently saturated yellow colored film to simulate the appearance of a gold film. This film survives thermal testing without developing haze.

A titanium cathode powered at 10 kilowatts at 640 volts is sputtered as in Example I except that the atmosphere at 4 millitorr pressure comprises less oxygen. One pass at 120 inches (about 3.05 meters) per minute with a slightly oxygen-deficient titanium oxynitride film which is somewhat more absorbing than the oxynitride film of Example I. A silver cathode powered at 441 volts at 2.4 amps is sputtered in pure argon at 4 millitorr to deposit a silver film over the titanium oxynitride coated surface in one pass at 120 inches (about 3.05 meters) per minute. To protect the silver film from oxidation, a very thin film of nickel alloy as in Example I is sputtered in argon at 4 millitorr in one pass at 120 inches (3.05 meters) per minute by a cathode target of Inconel 625 metal powered at 356 volts at one amp. The coated article has approximately the same luminous transmittance as the article of Example I, but the reflectance from the uncoated surface is 40.2 percent and the color coordinates are x = 0.3833 and y = 0.4093. The observed color is gold, a more saturated color than that of Example I.

The above examples are offered to illustrate the present invention. Various sputtering conditions may be employed, the ratio of oxygen and nitrogen may be varied and the titanium oxynitride film of the present invention may be employed at various thicknesses and configurations with other metal-containing films to provide a wide array of reflective colors. The scope of the present invention is defined by the following claims.

I claim:

1. An article of manufacture for the reflectance of solar energy comprising:
   a. a transparent substrate;
   b. a transparent film of titanium oxynitride;
   c. a first transparent metal film of a highly infrared reflective metal; and
   d. a second transparent metal film of a neutral metal.

2. An article of manufacture according to claim 1, wherein the substrate is glass.

3. An article of manufacture according to claim 2, wherein the reflective metal film comprises a metal selected from the group consisting of silver, gold, copper, aluminum and mixtures thereof.

4. An article of manufacture according to claim 3, wherein the metal is silver.

5. An article according to claim 1, wherein said neutral transparent metal film reduces the total luminous reflectance of the coated article.

6. An article according to claim 5, wherein said second neutral metal film comprises a metal alloy.

7. An article according to claim 6, wherein said metal alloy selected from the group consisting of nickel alloys and iron alloys.

8. An article according to claim 7, wherein said metal alloy is selected from the group consisting of stainless steel and Inconel.

9. An article according to claim 7, wherein said article exhibits a gold color in reflectance from the glass surface.

10. An article according to claim 1, wherein said transparent films of titanium oxynitride and infrared reflective metal are sputtered films.

11. A method of making a solar energy reflecting coated article comprising the steps of:
   a. sputtering onto a surface of a substrate a transparent coating of titanium oxynitride;
   b. sputtering in combination with said titanium oxynitride film a first transparent metal film of a highly infrared reflective metal; and
   c. sputtering over said highly infrared reflective transparent metal film a second transparent metal film of a neutral metal.

12. A method according to claim 11, wherein said substrate is glass.

13. A method according to claim 12, wherein said sputtering is magnetically enhanced.

14. A method according to claim 13, wherein said infrared reflective metal film is deposited by sputtering a metal selected from the group consisting of silver, gold, copper, aluminum and mixtures thereof in an inert atmosphere.

15. A method according to claim 14, wherein silver is sputtered in an atmosphere comprising argon.

16. A method according to claim 11, wherein said neutral transparent metal film reduces the luminous reflectance of the coated article.

17. A method according to claim 16, wherein said second metal film is a metal alloy.

18. A method according to claim 17, wherein said metal alloy is selected from the group consisting of iron alloys and nickel alloys.

19. A method according to claim 18, wherein the metal alloy is selected from the group consisting of stainless steel and Inconel.

20. A method, according to claim 19, wherein said metal alloy film does not alter the color of the coated article.

* * * * *